US008836355B2

(12) United States Patent
Wang et al.

(10) Patent No.: US 8,836,355 B2
(45) Date of Patent: Sep. 16, 2014

(54) DYNAMIC TESTING BASED ON THERMAL AND STRESS CONDITIONS

(75) Inventors: Mill-Jer Wang, Hsin-Chu (TW); Ching Nen Peng, Hsin-Chu (TW); Hung-Chih Lin, Hsin-Chu (TW); Hao Chen, Luzhou (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 743 days.

(21) Appl. No.: 13/082,769

(22) Filed: Apr. 8, 2011

(65) Prior Publication Data

US 2012/0256649 A1    Oct. 11, 2012

(51) Int. Cl.
*G01R 31/10*    (2006.01)
*G01R 31/28*    (2006.01)

(52) U.S. Cl.
CPC .......... *G01R 31/287* (2013.01); *G01R 31/2874* (2013.01); *G01R 31/2856* (2013.01); *G01R 31/2863* (2013.01); *G01R 31/2875* (2013.01)
USPC ............ 324/750.06; 324/762.03; 324/750.05; 324/762.05; 324/756.02; 324/762.01; 324/762.02; 324/750.01; 438/106; 438/14; 438/15; 702/118

(58) Field of Classification Search
CPC ........... G01R 31/2889; G01R 31/2886; G01R 31/2863; G01R 31/275; G01R 31/2891; G01R 1/0458; G01R 1/0491; H01L 2924/14; H01L 2224/16145; H01L 2225/06562
USPC ............ 324/762.03, 750.05, 762.05, 756.02, 324/762.01, 762.02, 750.01; 438/106, 14, 438/15; 702/118

See application file for complete search history.

(56) References Cited

U.S. PATENT DOCUMENTS

| 7,274,201 | B2 * | 9/2007 | Attalla et al. ............ 324/750.05 |
| 7,432,729 | B2 * | 10/2008 | Noel et al. ............... 324/750.05 |
| 2007/0159202 | A1 * | 7/2007 | Noel et al. ..................... 324/765 |
| 2010/0187682 | A1 * | 7/2010 | Pinjala et al. ................. 257/713 |
| 2010/0278211 | A1 * | 11/2010 | Pu et al. .......................... 374/57 |
| 2012/0061059 | A1 * | 3/2012 | Hsiao et al. .............. 165/104.33 |

* cited by examiner

*Primary Examiner* — Patrick Assouad
*Assistant Examiner* — Sean Curtis
(74) *Attorney, Agent, or Firm* — Slater & Matsil, L.L.P.

(57) ABSTRACT

A plurality of sets of test conditions of a die in a stacked system is established, wherein the plurality of test conditions are functions of temperatures of the die, and wherein the stacked system comprises a plurality of stacked dies. A temperature of the die is measured. A respective set of test conditions of the die is found from the plurality of sets of test conditions, wherein the set of test conditions corresponds to the temperature. The die is at the temperature using the set of test conditions to generate test results.

20 Claims, 7 Drawing Sheets

FIG. 4
TABLE 1

LOOK UP TABLE FOR ONE DIE, Spec = func(1 temp, stress)

| TEMPERATURE (°C) LAYER-1 (BOTTOM) | TEST CONDITIONS | DC PARAMETRIC CRITERION | CURRENT TEST CRITERION | VOLTAGE TEST CRITERION | FUNCTION TEST CRITERION |
|---|---|---|---|---|---|
| | | CRITERIA IS FUNCTION OF: | | | |
| -45°C – 0°C | 1. Pattern_a<br>2. Voltage_a<br>3. Timing_a<br>4. Others | thermal(stress)(Ohm) | Idd = func_1'(temp, stress) | Vbias = func_1'(temp, stress) | |
| 0.1°C – 25°C | 1. Pattern_a<br>2. Voltage_b<br>3. Timing_b<br>4. Others | Spec = func(temp, stress) | | | FUNCTION TEST: PASS/FAIL |
| 25.1°C – 65°C | 1. Pattern_a<br>2. Voltage_b<br>3. Timing_c<br>4. Others | IO CONNECTIVITY: Open_Short(mV)<br>POWER CONNECTIVITY: Power_Short(mA) | Idd = func_2'(temp, stress) | Vbias = func_2'(temp, stress) | SPEED TEST(MHz): PASS/FAIL<br>FREQUENCY: (MHz)=func(temp, stress) |
| 65.1°C – 100°C | 1. Pattern_b<br>2. Voltage_c<br>3. Timing_d<br>4. Others | RESISTANCE: R(m-ohm) | | Vbias = func_3'(temp, stress) | MEMORY TEST: Fail Bit Count(ea) |
| 100.1°C – 120°C | 1. Pattern_c<br>2. Voltage_d<br>3. Timing_e<br>4. Others | CAPACITANCE: C(f-F)<br>LEAKAGE: Leakage(nA) | Idd = func_3'(temp, stress) | | POWER CONSUMPTION: (mW)=func(temp, stress) |
| 120.1°C – 160°C | 1. Pattern_c<br>2. Voltage_d<br>3. Timing_f<br>4. Others | | Idd = func_4'(temp, stress) | Vbias = func_4'(temp, stress) | |

FIG. 5
TABLE 2

| LAYER-1 (BOTTOM) T1 TEMPERATURE (°C) | LAYER-2 (TOP) T2 TEMPERATURE (°C) | LOOK UP TABLE FOR JOINT TESTED DIES, Spec = func(temp, stress) | | | | |
|---|---|---|---|---|---|---|
| | | TEST CONDITIONS | DC PARAMETRIC CRITERION | CURRENT TEST CRITERION | VOLTAGE TEST CRITERION | FUNCTION TEST CRITERION |
| -45°C – 0°C | -55°C – 0°C | 1. Pattern_a 2. Voltage_a 3. Timing_a 4. Others | CRITERIA IS FUNCTION OF LAYER-1 AND LAYER-2: thermal(T1,T2) | | Vbias= func1'(T1, T2, R1, R2) | FUNCTION TEST: PASS/FAIL |
| | 0.1°C – 35°C | 1. Pattern_b 2. Voltage_c 3. Timing_d 4. Others | Spec = func(T1, T2, R1, R2) stress(R1, R2) | Idd= func1°(T1, T2, R1, R2) | Vbias= func5'(T1, T2, R1, R2) | SPEED TEST(MHz): PASS/FAIL |
| 0.1°C – 25°C | ... | ... | IO CONNECTIVITY: Open_Short(mV) POWER CONNECTIVITY: Power_Short(mA) | | ... | FREQUENCY: (MHz)=func(T1, T2, R1, R2) |
| 25.1°C – 65°C | -15°C – 15°C | 1. Pattern_b 2. Voltage_c 3. Timing_d 4. Others | RESISTANCE: R(m-ohm) CAPACITANCE: C(f-F) | Idd= func2(T1, T2, R1, R2) | Vbias= func5'(T1, T2, R1, R2) | MEMORY TEST: Fail Bit Count(ea) |
| | 15.1°C – 105°C | 1. Pattern_a 2. Voltage_b 3. Timing_c 4. Others | LEAKAGE: Leakage(nA) | Idd= func3(T1, T2, R1, R2) | Vbias= func7'(T1, T2, R1, R2) | POWER CONSUMPTION: (mW)=func(T1, T2, R1, R2) |

TO TABLE 2 (CONTINUED)

FIG. 5 (cont'd)
FROM TABLE 2

| | | | | | |
|---|---|---|---|---|---|
| | ... | ... | CRITERIA IS FUNCTION OF LAYER-1 AND LAYER-2: thermal(T1,T2) stress(R1, R2) | ... | FUNCTION TEST: PASS/FAIL |
| 65.1°C – 100°C | -25°C – 50°C | 1. Pattern_b 2. Voltage_e 3. Timing_e 4. Others | Spec = func(T1, T2, R1, R2) | Idd= func4(T1, T2, R1, R2) | Vbias= func3'(T1, T2, R1, R2) | SPEED TEST(MHz): PASS/FAIL |
| 100.1°C – 120°C | 50.1°C – 98°C | 1. Pattern_c 2. Voltage_d 3. Timing_e 4. Others | IO CONNECTIVITY: Open_Short(mV) | | Vbias= func6'(T1, T2, R1, R2) | FREQUENCY: (MHz)=func(T1, T2, R1, R2) |
| | 98.1°C – 160°C | 1. Pattern_d 2. Voltage_d 3. Timing_e 4. Others | POWER CONNECTIVITY: Power_Short(mA) RESISTANCE: R(m-ohm) | func5(T1, T2, R1, R2) | Vbias= func7'(T1, T2, R1, R2) | MEMORY TEST: Fail Bit Count(ea) |
| 120.1°C – 160°C | -15°C – 66°C | 1. Pattern_b 2. Voltage_h 3. Timing_d 4. Others | CAPACITANCE: C(f-F) | Idd= func6(T1, T2, R1, R2) | Vbias= func5'(T1, T2, R1, R2) | POWER CONSUMPTION: (mW)=func(T1, T2, R1, R2) |
| | 66.1°C – 190°C | 1. Pattern_c 2. Voltage_c 3. Timing_c 4. Others | LEAKAGE: Leakage(nA) | Idd= func7(T1, T2, R1, R2) | Vbias= func7'(T1, T2, R1, R2) | |

TABLE 2 (CONTINUED)

DYNAMIC TESTING BASED ON THERMAL AND STRESS CONDITIONS

BACKGROUND

Integrated circuits are formed on wafers and sawed into dies. The dies may be packaged as packages before they are used. To ensure that the reliability and the performance of the integrated circuit meet specifications, the dies and/or the respective packaged dies are tested.

The specifications of the integrated circuits typically specify the temperatures and the requirements corresponding to the temperatures. Typically, the specified temperatures may include −40° C., 25° C., and 105° C., for example. The pass/fail criteria for the tests performed at these temperatures are different. This posts a problem for testing stacked dies due to the fact that the stacked dies in the same package are typically at different temperatures.

Conventionally, there were two methods for testing stacked dies. In the first method, a prober chuck is used to heat a package including stacked dies. The bottom die contacts the prober chuck, and hence can be maintained at the temperature set by the prober chuck. Accordingly, the bottom die may be tested at the temperatures (for example, 105° C.) specified by the specification. However, due to the heat dissipation and the heat generated during the operation of the overlying dies, the temperatures of the overlying dies may be different from that of the prober chuck, wherein the temperatures of the overlying dies are not known. Accordingly, the circuit parameters obtained from the overlying dies are not obtained at the specified temperatures.

In the second method, each of the dies, particular the dies that are not in contact with the prober chuck, includes embedded sensors for measuring temperatures. Therefore, before measuring each of the dies overlying the bottom die, the respective sensor is used to measure the temperature in the respective overlying dies. The measured temperatures are used to adjust the temperature of the die according to the specification. For example, if a top die is measured with a temperature of 85° C., while the specification requires the respective testing temperature to be 90° C., the temperature (which might be at 105° C., for example) of the prober chuck is raised, so that the temperatures of the overlying dies are raised, until the temperature of the top die reaches 90° C. The soaking time for testing each of the overlying dies may be up to five minutes, for example, which is much longer than device test time, although the soaking time may be as short as tens of seconds. Therefore, by using this method, although the test conditions are aligned to the specification, the time for testing a stacked system may take up to tens of minutes, which is too long.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A method of for testing stacked system is provided in accordance with an embodiment. The variations and the operation of the embodiment are discussed. Throughout the various views and illustrative embodiments, like reference numbers are used to designate like elements.

Figure 1:
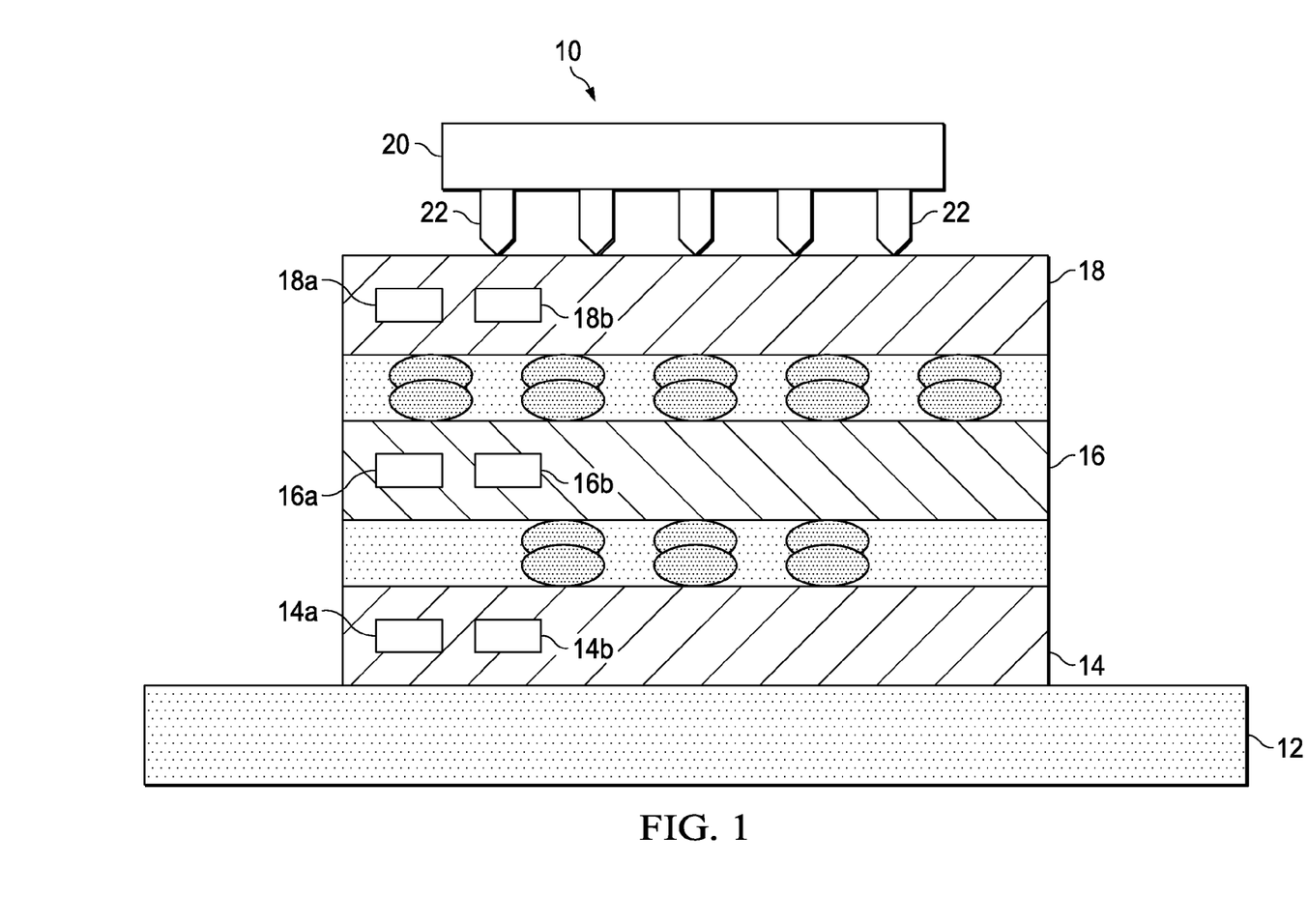
FIG. 1 illustrates a stacked system, wherein a bottom die, an intermediate die, and a top die are stacked and are tested on a prober chuck.

FIG. 1 illustrates exemplary stacked testing structure 10 for explaining the concept of the embodiments. It is noted that the methods provided by the embodiments may be used on the testing of stacked dies having structures different from what is shown in FIG. 1, and may be used on the testing of stacked systems under different temperatures (for example, below 0° C.). Accordingly, when testing the stacked dies in the packages, a prober chuck may be used to heat the dies. Alternatively, other methods may be used to cool or heat the stacked systems to different temperatures.

In FIG. 1, prober chuck 12 is provided, and is configured to be set to desirable temperatures, which may be, for example, from room temperature (21° C.) to 105° C. Accordingly, bottom die 14, intermediate die 16, and top die 18 are also heated.

Bottom die 14, intermediate die 16, and top die 18 are stacked. In an embodiment, bottom die 14 may, or may not, include thermal sensor 14a for sensing the temperature, and/or stress sensor 14b for sensing the stress in die 14. Intermediate die 16 includes thermal sensor 16a and/or stress sensor 16b. Top die 18 includes thermal sensor 18a and/or stress sensor 18b. Accordingly, the temperature and/or the stress in each of dies 14, 16, and 18 may be measured. Stress sensors 14b, 16b, and 18b may be ohmic sensors whose resistance values change in response to the change in the stresses applied on them. Therefore, the stresses may be expressed using normal stress units (such as pascal), or using resistance values (ohms). If resistance values are used to represent the stresses, the actual stresses may be found through the resistance values by using a table indicating the correspondence between resistances and stresses. The test may be performed through probe card 20, which includes probe pins 22 for probing the contact pads (not shown) at the surface of top die 18.

Figure 2:
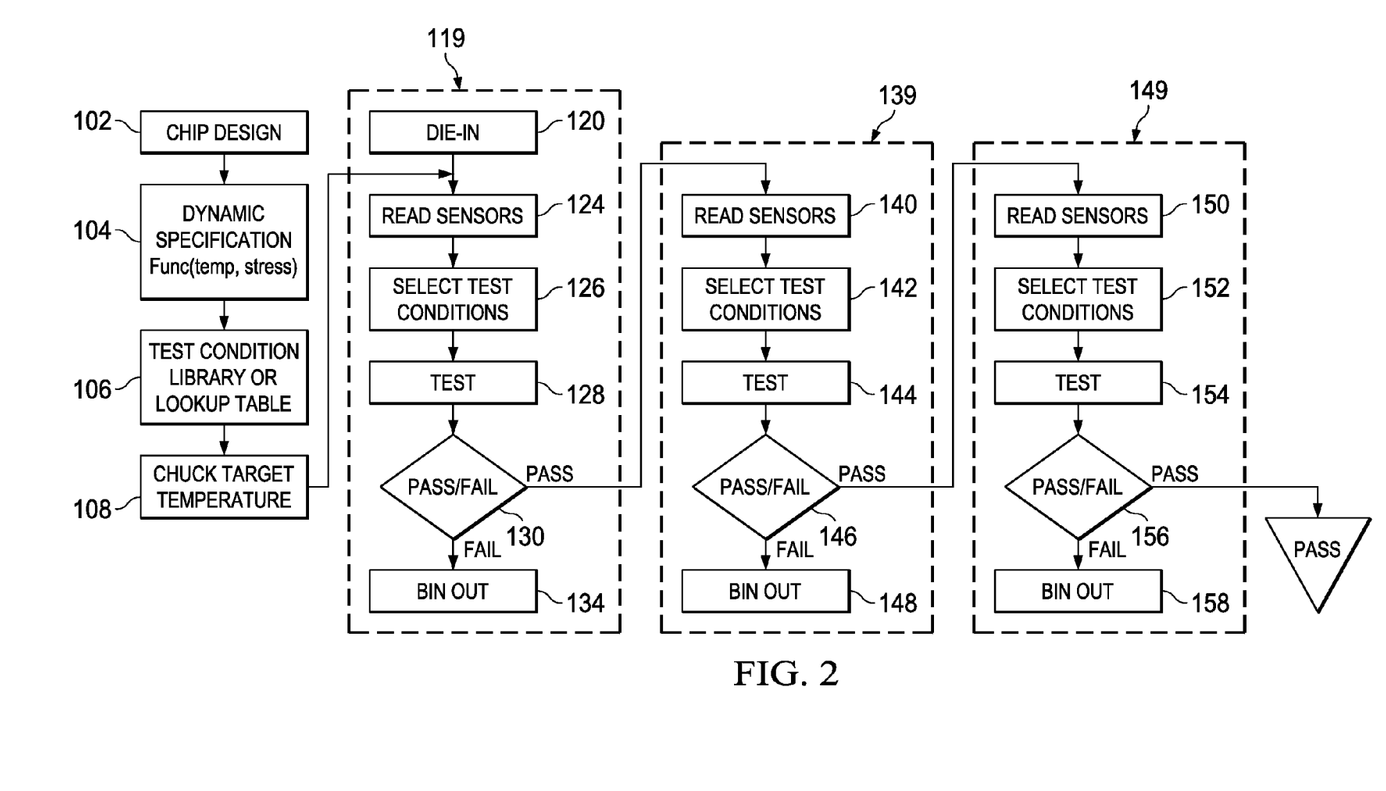
FIG. 2 illustrates a flow chart for testing the stacked system shown in FIG. 1, wherein the dies in the stacked system are tested one-by-one in accordance with various embodiments.

FIG. 2 illustrates a flow chart for the test of structure 10 (FIG. 1) in accordance with an embodiment. First, integrated circuit design (step 102) is performed to design the circuits of (chips) dies 14, 16, and 18 (FIG. 1). Next, dynamic specifications of dies 14, 16, and 18 are generated. Throughout the description, the term "dynamic specification" of a die refers to the specification of circuit parameters that are functions of temperatures, wherein the specification at testing temperature may be obtained from design simulations or found according to the actual temperature for testing the dies. Accordingly, the dynamic specification is different from the conventional fixed-temperature specification (such as the specifications for several discrete (isolated) and fixed temperatures such as −40° C., 25° C., and 105° C.). For example, in conventional specification, the pass/fail criteria of dies at −40° C., 25° C., and 105° C. may be defined. However, there was no specification for dies tested under temperatures that are not equal to −40° C., 25° C., or 105° C. Under the dynamic specification scheme, however, specifications may be generated for any temperature in all temperature range (such as −45° C. to 190° C.) that the die may be operated at. The dynamic specifications may include dynamic current (pass/fail) criteria such as drive currents Idd and dynamic voltage criteria such as Vbias. For example, the dynamic current criteria of Idd at a temperature indicates the maximum Idd the die can not exceed for the die to pass the test at this specific temperature. Otherwise, the die will be determined as being fail by the test.

Figure 4:
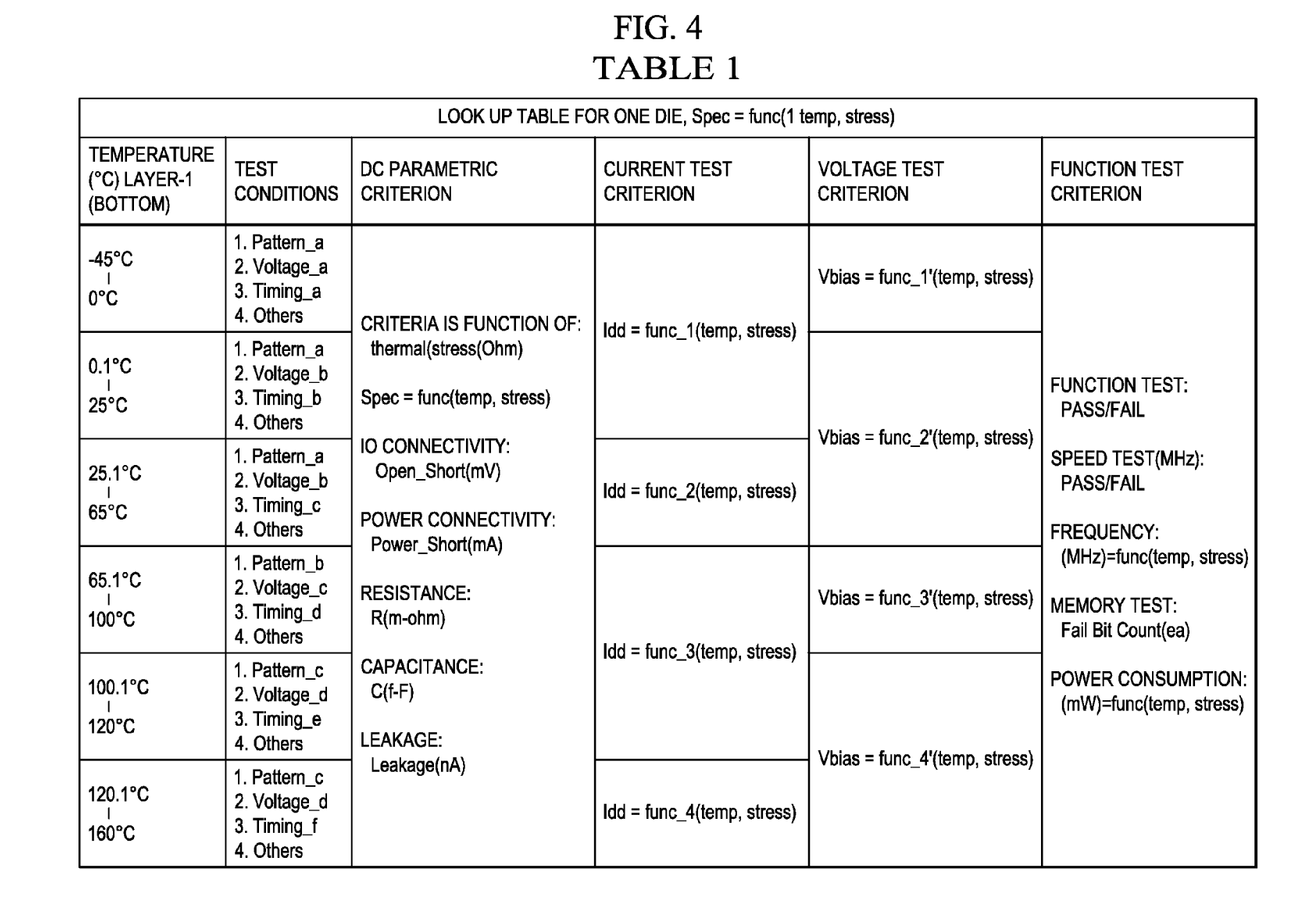
FIG. 4 illustrates Table 1, which illustrates an exemplary lookup table, wherein test conditions and dynamic specifications are functions of temperatures and/or stresses.

In an embodiment, the dynamic specifications (such as the dynamic current criteria and the dynamic voltage criteria) are functions of temperature and/or stress. This means that if dies are tested at different temperatures and/or stresses, the criteria will also change accordingly. The criteria may be expressed using equations, a database, lookup tables, or the like. Table 1 illustrates an exemplary lookup table, which includes the test conditions and the dynamic specifications as functions of temperatures and/or stresses. In Table 1, current criteria Idd is expressed as func_1(temp, stress) in temperature ranges −45° C.-25° C. as an example. The symbol "temp" represents the actual temperature of the die, and the symbol "stress" indicates the stress of the die. This example indicates that when the temperature and/or stress of the die change, the respective current specification (criteria) Idd also changes, and can be calculated through the respective function func_1 by inputting the temperature and the stress.

In Table 1 (FIG. 4), to express the current criteria more accurately, at different temperature ranges, the functions of the dynamic specifications may be different. For example, when the temperature is between −45° C. and 0° C., the dynamic current criteria may be expressed as:

$$\text{Idd}=\text{func\_1}(\text{temp, stress}) \quad [\text{Eq. 1}]$$

When test temperature is between 0.1° C. and 25° C., however, the dynamic current criteria may be expressed as:

$$\text{Idd}=\text{func\_2}(\text{temp, stress}) \quad [\text{Eq. 2}]$$

It is appreciated that func_1 may be the same as, or different from, func_2, depending on the behavior of the respective parameter (Idd in this example). Table 1 also provides more criteria functions such as Idd=func_3(temp, stress) and Idd=func_4(temp, stress).

Similarly, as shown in Table 1, the dynamic voltage criteria, such as Vbias, may also be expressed as the functions of temperatures and/or stresses, such as func_1'(temp, stress), func_2'(temp, stress), func_3'(temp, stress), and func_4' (temp, stress). It is appreciated that Idd and Vbias are only exemplary dynamic criteria, and more dynamic current and/or voltage criteria may be specified in Table 1. In addition, the dynamic specifications may include other circuit parameters that are to be tested, such as the speed criteria, the frequency criteria, the power consumption criteria, and the like. The dynamic specification of these circuit parameters may also be expressed as the functions of temperature and/or stress (func (temp, stress)), similar to the dynamic current criteria and the dynamic voltage criteria.

The dynamic specifications (step 104 in FIG. 2) may be established using simulations, testing golden samples, and/or calculations. For example, the current Idd of a golden sample is measured at −40° C., 25° C., and 105° C. The measured results may indicate that the measured Idd are about 10 percent higher than the respective specification (pass/fail criteria) at each of −40° C., 25° C., and 105° C. The Idd of the golden sample is also measured at multiple temperatures throughout the operation temperature range of the golden sample. Assuming at 35° C., the measured value of Idd is Idd1, then the criteria at 35° C. may be close to Idd1*(1/1.1). With multiple points of specifications obtained using this exemplary method, the Idd specification for the entire operation temperature range may be obtained as a continuous function, and may be expressed using a library, lookup tables (step 106 in FIG. 2), equations, data bases, or the like. The dynamic specification may also be obtained and/or tuned by simulation results and calculation results.

With the dynamic specifications being obtained, it is not necessary to measure dies at the several fixed temperatures (such as −40° C., 25° C., and 105° C.), which temperatures are pre-determined by the specification of the respective design of the respective integrated circuit. Instead, the dies may be tested at other temperatures not specified by the specification of the circuit. The test results may be compared to the dynamic specification at the actual temperature the test is performed. If the dies fail (or pass) at the actual test temperature, it is expected that the dies will also fail (or pass) at the fixed temperatures specified by the specifications of the circuits.

Referring back to FIG. 2, in step 108, prober chuck 12 (FIG. 1) is set to a target temperature, for example, 105° C. Steps in dashed box 119 indicate the steps for testing bottom die 14. In step 120, structure 10 including dies 14, 16, and 18 is fixed on prober chuck 12. In step 124, sensors 14a and/or 14b (FIG. 1) in bottom die 14 are used to measure the temperature and the stress, respectively, of bottom die 14. The temperature is likely, although not necessarily, to be around 105° C. if prober chuck 12 is set to 105° C. The sensed temperature may be used to dynamically determine the test conditions for testing bottom die 14 (step 126). In alternative embodiments, since bottom die 14 is likely to have a temperature close to the temperature of prober chuck 12 (FIG. 1), step 124 is skipped, and the temperature of prober chuck 12 is assumed as being the temperature of bottom die 14.

In step 126, dynamic test conditions are determined. The dynamic test conditions are the test conditions correspond to the actual temperature and/or the stress measured from die 14. In an embodiment, the test conditions are provided in the form of a lookup-table such as Table 1. In other embodiments, other means such as equations, a database, and the like may be used.

Referring to Table 1, in an exemplary embodiment, the dynamic test conditions include (test) patterns, voltages, timing, etc. In Table 1, each of the patterns, voltages, and timing may be postfixed with a letter (a, b, c, d, e, f, etc), to distinguish one from others. As shown in Table 1, each set of test conditions corresponds to a temperature range of bottom die 14.

Assuming Table 1 illustrates the exemplary lookup-table of bottom die 14, then intermediate die 16 and top die 18 may have their own lookup tables, which may be the same or different from Table 1, depending on whether the structures and the functions of dies 16 and 18 are the same as the respective structure and functions of die 14 or not.

Assuming the temperature of bottom die 14 is 104° C., from Table 1, it is found that 104° C. correspond to the temperature range of 100.1° C. to 120° C. Accordingly, the dynamic test conditions are found as including "pattern_c, voltage_d, timing_e," etc. These test conditions are then used to test bottom die 14 (step 128, FIG. 2). The test results are then compared to the respective dynamic specifications (of 104° C.) to determine whether bottom die 14 passes or fails the test. For example, referring to Table 1, it is found that when test temperature is 104° C., the respective dynamic current criteria Idd should be determined using func$_{\_3}$(104° C., stress), wherein the stress value is found using the value provided by sensor 14b (FIG. 1). The respective voltage criteria Vbias should be func$_{\_4'}$(104° C., stress).

Furthermore, the testing of die 14 may include other test items, which may include DC parameters such as IO connect (in mV), power connect (in mA), resistance (in ohm or m-ohm), leakage, and the like, as also shown in Table 1 as a column named "DC Parametric Criterion." The dynamic specifications of these parameters may also be the functions of temperature and/or stress. In addition, the speed, frequency, memory, and power consumption (refer to the column "Function Test Criterion") are also tested, whose dynamic specifications may also be the function of temperature and/or stress. By comparing the test results (step 130 in FIG. 2) with the respective dynamic specifications, bottom die 14 either passes or fails. If it fails the test, structure 10 is put into the fail bin (step 134). Otherwise, the test proceeds to the testing of the next die.

Dashed box 139 in FIG. 2 includes the steps for testing top die 18, assuming top die 18 is to be tested next (the sequence may be in other orders). Temperature sensor 18a and/or stress sensor 18b are use to measure the temperature and the stress in die 18 (step 140). The test may be performed immediately after the testing of die 14 without adjusting the temperature of die 18 and prober chuck 12 (FIG. 1). As a result, from the time the test of die 14 ends to the time the test of die 18 starts, the temperature of die 14 is substantially unchanged. Die 18 may be at, or may be deviated from, a desirable target temperature. For example, the target temperature of die 18 may be 90° C. However, the measured temperature may indicate that die 18 is at 98° C. Die 18 is tested regardless of its measured temperature. However, the dynamic test conditions corresponding to the actual measured temperature is found (step 142) and used. Assuming lookup-table Table 1 is also the lookup table of die 18, it is found that 98° C. corresponds to the temperature range 65.1° C.-100° C. Accordingly, the dynamic test conditions are found as including "pattern_b, voltage_c, timing_d," etc. These test conditions are then used to test die 18 (step 144 in FIG. 2). The test results are then compared to the respective dynamic specifications to determine whether die 18 passes or fails the test. For example, referring to Table 1, it is found that when the measured temperature is 98° C., the respective dynamic current criteria Idd should be calculated using func$_{\_3}$(98° C., stress), wherein the stress value is found using the value provided by sensor 18b (FIG. 1). Similarly, other DC parameters and functional parameters such as speed, frequency, and power consumptions are measured, and compared to (step 146 in FIG. 2) the respective dynamic specifications to determine whether die 18 fails or passes the test. If it fails the test, structure 10 is put into the fail bin (step 148 in FIG. 2). Otherwise, the test proceeds to the testing of the next stacked die, as shown in dashed box 149.

The testing of intermediate die 16 is shown in dashed box 149, and is essentially the same as the testing of top die 18, except the temperature and the stress are read from sensors 16a and 16b (step 150), respectively, and the dynamic test conditions are obtained from the respective lookup-table of die 16 (step 152). After the test using the respective dynamic test conditions (step 154), the testing results are compared to the dynamic specifications of die 16. The details for determining the dynamic test conditions and the dynamic specifications are essentially the same as that for dies 14 and 18, and hence are not discussed herein. The steps are shown as 154, 156, and 158. If there are more dies stacked together, the additional dies may be tested according to the testing method of dies 16 and 18.

Figure 3:
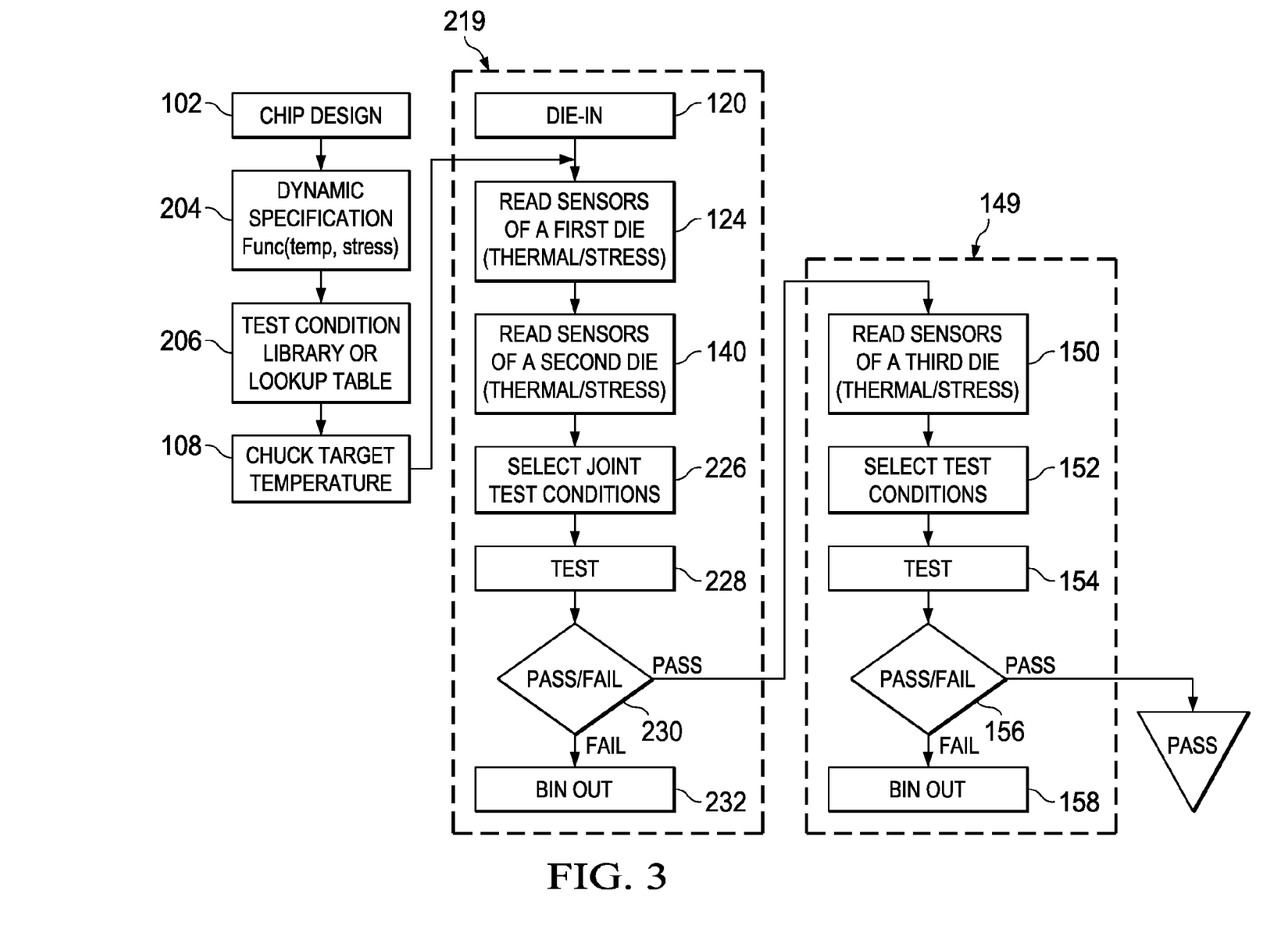
FIG. 3 illustrates a flow chart for testing the stacked system shown in FIG. 1, wherein the two dies in the package are joint tested in accordance with various embodiments.
Figure 5:
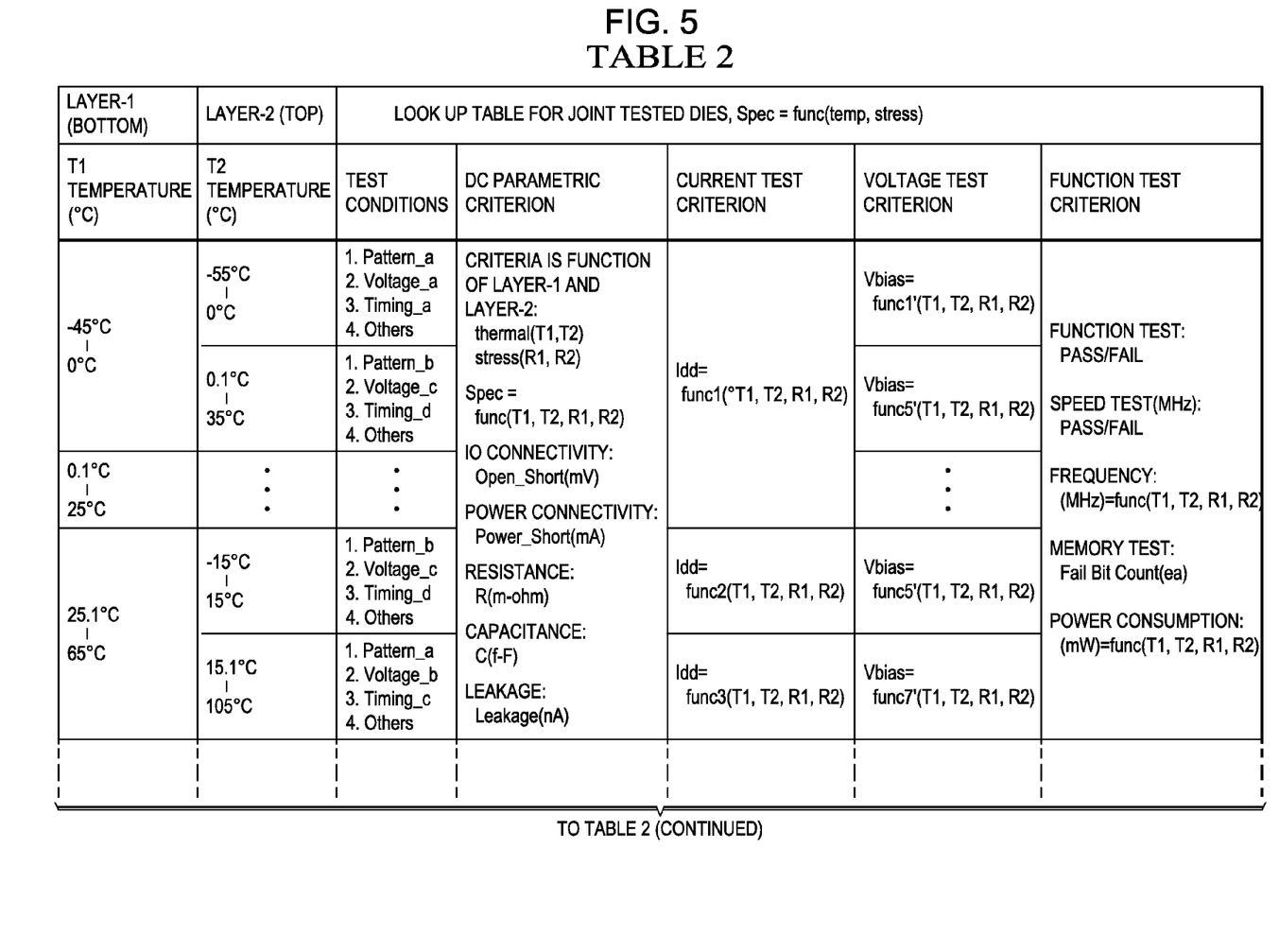
FIG. 5 illustrates Table 2, which illustrates an exemplary lookup table, wherein test conditions and dynamic specifications for the joint test of two dies in a same stacked system are functions of temperatures of and/or stresses of both dies.

FIG. 3 illustrates an alternative embodiment. In this embodiment, two dies (such as dies 14 and 18) are functionally associated, and hence need to be joint tested in a same test. Some of the steps in these embodiments are essentially the same as in the embodiment shown in FIG. 2. Accordingly, these steps are marked using like reference numerals as in FIG. 2. The details of these steps can be found in the discussion of the embodiment shown in FIG. 2, and are not repeated herein. The functionally associated dies may be any two, or more than two, of the dies in the package. Referring to FIG. 3, in step 204, the dynamic specifications are established as the functions of temperature and/or stress. In these embodiments, the dynamic specifications may be the functions of the temperatures and/or stresses of both die 14 and die 18. Table 2 illustrates an exemplary lookup table for both dies 14 and 18. The lookup table of die 16 in these embodiments may be similar to Table 1 assuming it is not joint tested with other dies.

Referring to Table 2 in FIG. 5, two temperatures, temperature T1 of die 14 and temperature T2 of die 18, which are actual measured temperatures, may be needed to index into Table 2. Accordingly, the dynamic specifications such as Idd and Vbias are related to both temperatures T1 and T2, and/or the stresses (represented using resistances R1 and R2) of dies 14 and 18. Also, to find dynamic test conditions and dynamic specifications, both the measured temperatures T1 and T2 are needed to index into Table 2, as will be discussed in the example shown in FIG. 3. Dynamic criteria Idd may be expressed as func1(T1, T2, R1, R2) through func7(T1, T2, R1, R2), and Vbias may be expressed as func1'(T1, T2, R1, R2) through func7'(T1, T2, R1, R2). Similarly, other parameters such as DC parameters, speed, frequency, power consumption, and the like, may be the functions of (T1, T2, R1, R2) also.

Referring back to FIG. 3, in step 206, the joint dynamic test conditions for joint testing dies 14 and 18 are established, and may be stored as a library or lookup tables such as Table 2. Since the temperatures of die 14 and 18 may be different from each other, and the deviation of temperature T1 of die 14 may not be synced with the deviation of temperature T2 of die 18, when die 14 is in one temperature range, die 18 may be in one of several other temperature ranges. For example, in Table 2, when die 14 is in temperature range (T1) 100.1° C.-120° C., the temperature of die 18 may be in any of temperature ranges (T2) −25° C. to 50° C., 50.1° C. to 98° C., and 98.1° C. to 160° C. Accordingly, Table 2 include three sets of dynamic test conditions for temperature range (T1) of 100.1° C. to 120° C., each corresponding to one temperature range (T2) of die 18.

Referring again to FIG. 3, when dies 14 and 18 are joint tested, the temperatures and/or stresses of both die 14 and die 18 are read from the respective sensors, as shown as steps 124 and 140. Next, in step 226, the joint dynamic test conditions for testing dies 14 and 18 are determined from lookup-table Table 2 by looking at the respective temperature ranges for dies 14 and 18. For example, assuming die 14 is at 104° C. (T1), and die 18 is at 98° C. (T2), it is found that the respective dynamic joint test conditions include (patter_c, voltage_d, timing_e). The respective dynamic specification (pass/fail criteria) for Idd is func5(104° C., 98° C., R1, R2), and the respective specification (criteria) for Vbias is func6'(104° C., 98° C., R1, R2). It is noted that the illustrated Idd and Vbias as shown in Table 2 actually represent the specifications of both dies 14 and 18, which means that there may be one dynamic Idd specification for die 14, and another Idd dynamic specification for die 18, with both being the functions of (104° C., 98° C., R1, R2). In addition, the dynamic joint test conditions such as (pattern_c, voltage_d, timing_e) also include the test conditions of die 14 and the test conditions of die 18. It is appreciated that although in the exemplary embodiments as in FIG. 2 and Table 2, the dynamic joint test conditions are determined from two layers, the dynamic joint test conditions may be the functions of more than two layers. Table 2 may thus be modified accordingly to add the temperatures of more layers as indices. The dynamic joint test conditions may be indexed through the measured temperatures of more than two layers.

Next, in step 228 of FIG. 3, both dies 14 and 18 are tested, and the results are compared to the dynamic specifications of the respective dies 14 and 18. The remaining steps for testing die 16 may be the same as in FIG. 2, and hence is not discussed herein.

In above-discussed embodiments, both temperature and stresses are measured from the tested dies. In alternative embodiments, stress sensors 14b, 16b, and 18b are not formed or used, and the dynamic specifications are functions of temperatures, but not stresses. The steps for establishing and using the respective lookup tables may be obtained by removing the expression "stress," "R1," and "R2" from FIGS. 2 and 3, and from Tables 1 and 2. One skilled in the art will realize the respective embodiments by applying the teaching provided in the above-discussed embodiments.

Figure 1A:
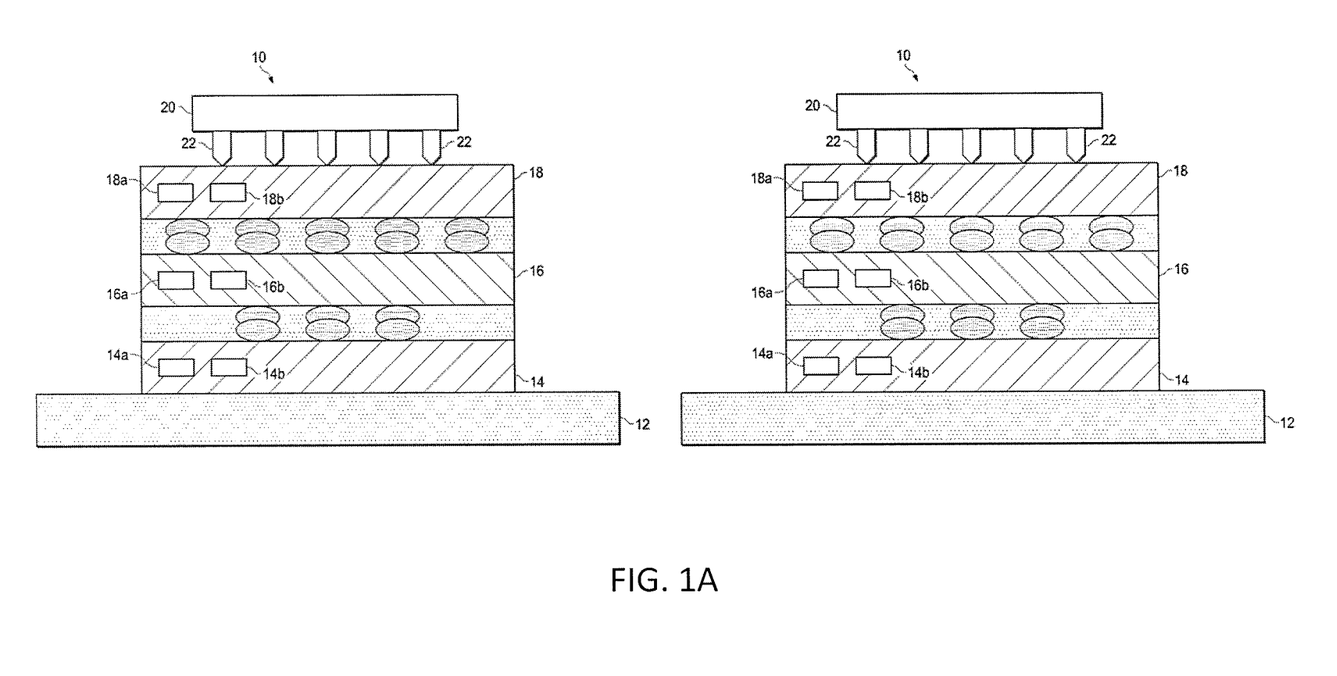
FIG. 1A illustrates two stacked systems tested on two identical prober chucks in accordance with some embodiments.

Furthermore, the testing may include testing a plurality of packages having an identical structure. For example, FIG. 1A illustrates that two packages 10 have an identical structure, with each of the two packages 10 being heated by one of two prober chucks 12, and with the two prober chucks being identical to each other. The temperatures and/or stresses measured from dies 14 (or dies 16 or dies 18) in different packages 10 may be different. Accordingly, even if the packages 10 have the same structure, due to the dynamic test condition selection, the test conditions for testing die 14 (or die 16 or die 18) in one package may be different from the die 14 (or die 16 or die 18) in another package. The specifications (pass/fail criteria) for die 14 (or die 16 or die 18) in one package may also be different from that of die 14 in another package due to the difference in actual measured temperatures.

By using the embodiments, there is no need to adjust the temperature of each die to the several fixed temperatures specified in the specifications. Rather, the temperature may be measured, and the dies may be tested regardless of their temperatures. The soak time for adjusting the temperatures of dies is thus eliminated. The accuracy of the testing, on the other hand, is not compromised since the test results are compared with the dynamic specifications, which correspond to the actual temperatures the tests are performed.

In accordance with embodiments, a plurality of sets of test conditions of a die in a package is established, wherein the plurality of test conditions are functions of temperatures of the die, and wherein the package comprises a plurality of stacked dies. A temperature of the die is measured. A respective set of test conditions of the die is found from the plurality of sets of test conditions, wherein the set of test conditions corresponds to the temperature. The die is at the temperature using the set of test conditions to generate test results.

In accordance with other embodiments, a method includes establishing a dynamic pass/fail specification of the die in a package, wherein the dynamic pass/fail specification is a function of temperatures of the die, and wherein the package comprises a plurality of stacked dies. A temperature of the die is measured. A pass/fail criteria of the die corresponding to the temperature is found. The die at the temperature is tested to generate test results. The test results are compared with the pass/fail criteria to determine a pass/fail status of the die.

In accordance with yet other embodiments, a method includes providing a first and a second package identical to each other, wherein the first package comprises a first die identical to a second die in the second package; heating the first die by heating a first prober chuck attached to the first package to a target temperature; heating the second die by heating a second prober chuck attached to the second package to the target temperature; measuring a first temperature of the first die when the first prober chuck is at the target temperature; measuring a second temperature of the second die when the second prober chuck is at the target temperature, wherein the first temperature is different from the second temperature; finding a first set of test conditions from a lookup table storing test conditions as functions of temperatures, wherein the first set of test conditions corresponds to the first temperature; finding a second set of test conditions from the lookup table, wherein the second set of test conditions corresponds to the second temperature, and wherein the first set of test conditions is different from the second set of test conditions; testing the first die using the first set of test conditions to generate first test results; and testing the second die using the second set of test conditions to generate second test results.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
establishing a plurality of sets of test conditions of a first die in a stacked package, wherein the plurality of test conditions are functions of temperatures of the first die, and wherein the stacked package comprises a plurality of stacked dies;
measuring a first temperature of the first die;
finding a respective set of test conditions of the first die from the plurality of sets of test conditions, wherein the set of test conditions corresponds to the first temperature; and
testing the first die at the first temperature using the set of test conditions to generate test results.

2. The method of claim 1 further comprising:
establishing a dynamic pass/fail specification of the first die, wherein the dynamic pass/fail specification is a function of temperatures of the first die;
finding a pass/fail criteria of the first die from the dynamic pass/fail specification, wherein the pass/fail criteria corresponds to the first temperature; and
comparing the test results with the pass/fail criteria to determine a pass/ fail status of the first die.

3. The method of claim 2, wherein the dynamic pass/fail specification of the first die is a function of a stress in the first die, and wherein the method further comprises:
measuring a stress of the first die at the first temperature, wherein the pass/fail criteria of the first die further corresponds to the stress of the first die.

4. The method of claim 1 further comprising, before the steps of measuring the first temperature of the first die and testing the first die, testing a second die in the stacked package, wherein between the step of testing the second die and the step of measuring the first temperature, the temperature of the first die is not changed.

5. The method of claim 1, wherein the step of establishing the plurality of sets of test conditions of the first die comprises establishing a lookup table comprising a plurality of temperature ranges, each corresponding to one of the plurality of sets of test conditions.

6. The method of claim 5, wherein the lookup table further comprises a plurality of dynamic specifications different from each other, wherein each of the dynamic specifications corresponds to one of the plurality of temperature ranges, and wherein the plurality of dynamic specifications is selected from the group consisting essentially of a current specification, a voltage specification, a frequency specification, a power consumption specification, DC parameter specifications, and combinations thereof.

7. The method of claim 1, wherein the stacked package further comprises a second die, and wherein the plurality of test conditions are functions of temperatures of the first die and the second die.

8. The method of claim 7 further comprising:
establishing dynamic pass/fail specifications of the first die and the second die, wherein the dynamic pass/fail specifications are functions of the temperatures of the first die and the second die;
measuring a second temperature of the second die, wherein the set of test conditions comprises joint test conditions of the first die and the second die, and wherein the set of test conditions corresponds to the first temperature of the first die and the second temperature of the second die; and
testing the second die using the set of test conditions.

9. The method of claim 8, wherein the dynamic pass/fail specifications of the first die and the second die are further functions of stresses in the first die and the second die.

10. A method comprising:
establishing a dynamic pass/fail specification of a first die in a package, wherein the dynamic pass/fail specification is a function of temperatures of the first die, and wherein the package comprises a plurality of stacked dies;
measuring a first temperature of the first die;
finding a pass/fail criteria of the first die corresponding to the first temperature;
testing the first die at the first temperature to generate test results; and
comparing the test results with the pass/fail criteria to determine a pass/fail status of the first die.

11. The method of claim 10 further comprising:
establishing a plurality of sets of test conditions of the first die, wherein the plurality of test conditions is functions of the temperatures of the first die; and
finding a respective set of test conditions of the first die from the plurality of sets of test conditions, wherein the set of test conditions corresponds to the first temperature, and wherein the step of testing the first die is performed using the set of test conditions.

12. The method of claim 11, wherein the dynamic pass/fail specification of the first die is further a function of a stress in the first die, and wherein the method further comprises:
measuring a stress of the first die at the first temperature, wherein the pass/fail criteria of the first die corresponds to the stress of the first die.

13. The method of claim 10 further comprising, before the steps of measuring the first temperature of the first die and testing the first die, testing a second die in the package, and wherein between the step of testing the second die and the step of measuring the first temperature, the temperature of the first die is substantially not changed.

14. The method of claim 10, wherein the step of establishing the dynamic pass/fail specification of the first die comprises establishing a lookup table comprising a plurality of temperature ranges, each corresponding to one of a plurality of dynamic pass/fail specifications.

15. The method of claim 14, wherein the lookup table further comprises a plurality of sets of test conditions different from each other, wherein each of the plurality of sets of test conditions corresponds to one of the plurality of temperature ranges.

16. The method of claim 10, wherein the package further comprises a second die, and wherein the dynamic pass/fail specification is a function of temperatures of the first die and the second die.

17. A method comprising:
providing a first and a second package identical to each other, wherein the first package comprises a first die identical to a second die in the second package;
heating the first die by heating a first prober chuck attached to the first package to a target temperature;
heating the second die by heating a second prober chuck attached to the second package to the target temperature;
measuring a first temperature of the first die when the first prober chuck is at the target temperature;
measuring a second temperature of the second die when the second prober chuck is at the target temperature, wherein the first temperature is different from the second temperature;
finding a first set of test conditions from a lookup table storing test conditions as functions of temperatures, wherein the first set of test conditions corresponds to the first temperature;
finding a second set of test conditions from the lookup table, wherein the second set of test conditions corresponds to the second temperature, and is different from the second set of test conditions;
testing the first die using the first set of test conditions to generate first test results; and
testing the second die using the second set of test conditions to generate second test results.

18. The method of claim 17, wherein the lookup table comprises a plurality of temperature ranges corresponding to a plurality of sets of test conditions, wherein the plurality of temperature ranges are in different rows or columns of the lookup table.

19. The method of claim 17, wherein the lookup table further comprises dynamic pass/fail specifications of dies expressed as functions of temperatures.

20. The method of claim 19, wherein the dynamic pass/fail specifications of the dies are further expressed as functions of stresses in the dies.

* * * * *